United States Patent [19]

Stephenson, Jr. et al.

[11] 4,160,274
[45] Jul. 3, 1979

[54] SINGLE CHIP MOLDED MAGNETIC BUBBLE MEMORY PACKAGE

[75] Inventors: Alvis D. Stephenson, Jr., Dallas; James T. Carlo, Richardson, both of Tex.

[73] Assignee: Texas Instruments Incorporated, Dallas, Tex.

[21] Appl. No.: 752,039

[22] Filed: Dec. 20, 1976

[51] Int. Cl.² ............................................ G11C 5/04
[52] U.S. Cl. ....................................................... 365/2
[58] Field of Search ........................ 340/174 TF; 365/2

[56] References Cited

U.S. PATENT DOCUMENTS

| 3,864,671 | 2/1975 | Myer | 365/2 |
| 3,996,574 | 12/1976 | Bobeck et al. | 340/174 TF |
| 4,012,723 | 3/1977 | Harper | 340/174 TF |
| 4,096,581 | 6/1978 | Carlo et al. | 365/2 |
| 4,110,838 | 8/1978 | Noe et al. | 365/2 |

OTHER PUBLICATIONS

IEEE Transactions on Magnetics, vol. Mag-9, No. 3, Sep. 1973 pp. 429-433.

*Primary Examiner*—James W. Moffitt
*Attorney, Agent, or Firm*—Melvin Sharp; Richard L. Donaldson; William E. Hiller

[57] ABSTRACT

A magnetic bubble domain package in which a magnetic bubble domain chip is bonded to conductors disposed on a thin film interconnect member which is formed to allow a reduction in the volume of the drive coils of the package. The conductors of the interconnect member are bonded to a lead frame which provides signal leads for the magnetic bubble domain chip and the drive coils. The interconnect member with magnetic bubble domain chip and lead frame bonded thereto is encapsulated with a molding compound, the chip being located precisely within the mold in order to insure placement of the chip in the geometric center of the drive coils. The drive coils are prewound and slipped onto the premolded package through slots formed during the molding process to reduce the volume of the coils, and the coils terminated directly onto the signal leads of the lead frame. This chip substructure is supplied with the magnetic field prependicular to the planar surface of the chip by means of a bias field structure formed by permanent magnets secured within an open ended tubular housing which acts as a shield to shunt stray magnetic fields in the external operating environment of the device. A second molding operation encapsulates the chip substructure within the bias field structure to complete the package.

10 Claims, 7 Drawing Figures

SINGLE CHIP MOLDED MAGNETIC BUBBLE MEMORY PACKAGE

BACKGROUND OF THE INVENTION

This invention relates to magnetic bubble domain chip packages and, more particularly, to a magnetic bubble domain chip package in which in insulating film interconnect member insures exact placement of the magnetic bubble domain chip within the drive field coils and allows a reduction in the volume of the drive field coils. The interconnect member is molded in an operation which enables the molding material to be in direct contact with the magnetic bubble domain chip, thereby insuring the placement of the chip within the geometric center of the drive field coil assembly.

With the advancement of magnetic bubble domain technology, the development of a smaller, lightweight package assembly which can be mass produced in an inexpensive manner to provide a reliable magnetic bubble domain device has become a desirable goal. Because of the special requirements and operating features of magnetic bubble domain chips, the packaging of these devices presents a unique problem. Unlike the packaging of semiconductor devices, for example, the packaging of magnetic bubble domain chips requires the association of two magnetic fields with each magnetic bubble domain chip—a constant bias field perpendicular to the plane of the chip which maintains the bubble domains in a non-volatile state, and a rotary magnetic drive field in the plane of the bubble-supporting film of the chip which controls the movement of the bubble domains. The provision of the rotary magnetic drive field in a suitable packaging assembly presents an especially difficult problem. The rotary magnetic field is typically provided by winding two electrical coils in orthogonal relationship with respect to each other and then driving them with electrical signals which are 90° out of phase with each other. Placing the orthogonally related coils inside a package assembly of a type heretofore known results in the signal leads to the chip being routed through the coils, thus increasing the size of the coils and, necessarily, the power required to drive them. Locating the orthogonally related coils external to the package assembly causes these coils to have an even larger volume with correspondingly larger power requirements. In addition, external placement of these coils with respect to the package assembly results in a physically awkward package of relatively large size.

Moreover, it is important to insure that the package assembly provides for the active surface of the magnetic bubble domain chip to be located at the geometric center of the drive field coils where the magnetic drive field is most uniform. When this condition is not met in a given package assembly and the magnetic bubble domain chip is offset with respect to the geometric center of the drive coils, noise interference at the surface of the chip results, thus adversely affecting its operation. Supporting structures for the drive field coils, if included in the package assembly to provide the necessary geometric relationship between the coils and the chip, tend to increase the volume of the coils with a consequent greater power demand to drive the coils.

SUMMARY OF THE INVENTION

In accordance with the present invention, a magnetic bubble domain package is provided which includes a generally E-shaped insulating film interconnect member having a chip-supporting central portion with two longitudinal slots on opposite sides thereof, thereby defining parallel leg portions spaced apart from the central chip-supporting portion on opposite sides thereof. A plurality of narrow line conductors are disposed on the surface of the interconnect member which provide external access to the magnetic bubble domain chip through signal leads bonded to the conductors along the leg portions of the interconnect member. The interconnect member with a magnetic bubble domain chip bonded thereto on the central chip-supporting portion is encapsulated in a thin film of molding material. The mold employed during the encapsulation operation includes a plurality of support pins whcih maintain the magnetic bubble domain chip at a location in the vertical center of the molding material. The mold also preserves the E-shape of the interconnect member, by retaining the longitudinal slots of the interconnect member after the encapsulation operation. A set of orthogonally wound drive field coils is provided, the first coil being wound around the encapsulated magnetic bubble domain chips as mounted on the central portion of the interconnect member of the molded assembly through the longitudinal slots of the assembly and the second coil being wound around the first coil in orthogonal relationship thereto. Because the coils are separated from the magnetic bubble domain chip by only a thin film of molding material, the volume of the drive field coils is substantially reduced. In addition, the structural configuration of the interconnect member in association with the mold enable the magnetic bubble domain chip to be located in the geometric center of the drive field coils. A magnetic bias field perpendicular to the plane of the chip and which maintains the magnetic bubbles in a non-volatile state, is provided within an open-ended tubular housing constructed of shielding material by permanent magnets attached inside the housing. Bias spreader plates may be secured to the permanent magnets for maintaining uniformity of the magnetic bias field. The encapsulated chip assembly with the drive field coils mounted thereon is disposed within the tubular housing. A final molding operation fills the tubular housing with a body of insulating material in which the previously encapsulated chip assembly with the drive field coils is embedded.

DETAILED DESCRIPTION

Figure 1:
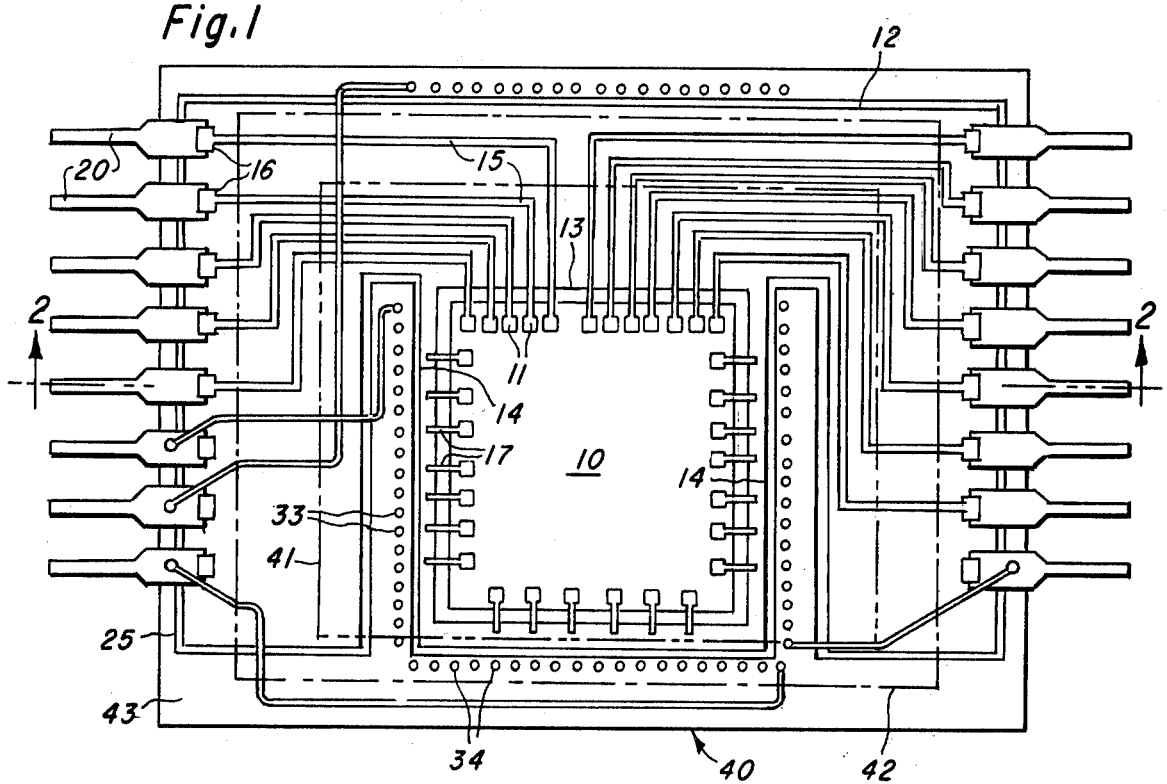
FIG. 1 is a top cut-away view of a magnetic bubble domain package in accordance with this invention.
Figure 2:
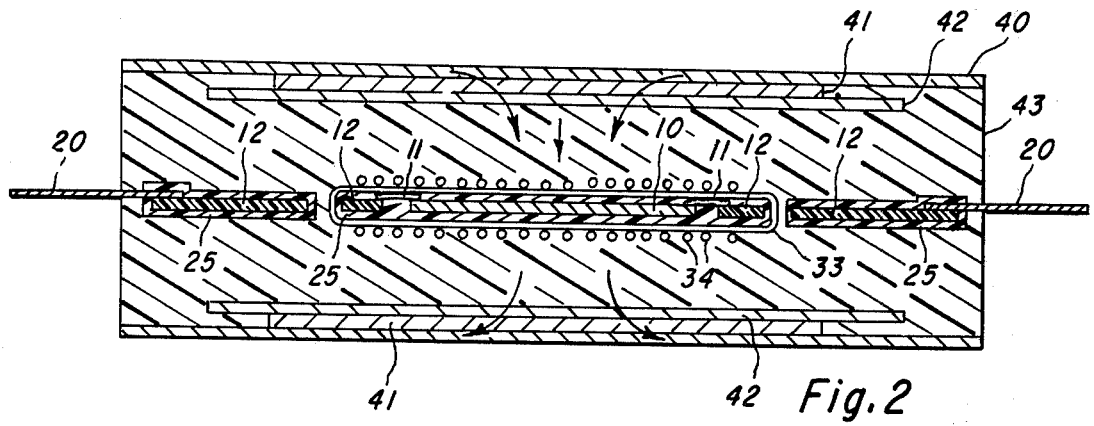
FIG. 2 is a cross-sectional view of the magnetic bubble domain package taken along the section line 2-2 of FIG. 1.

Referring more particularly to the drawings, FIGS. 1 and 2 illustrate a magnetic bubble domain package in accordance with this invention. A magnetic bubble domain chip 10 comprises a thin film of bubble-supporting magnetic material disposed on a substrate of nonmagnetic material and having an overlay pattern of magnetizable material disposed on the bubble-supporting film. The magnetic film has magnetically easy directions essentially perpendicular to the plane of the film, so that a magnetic bias field applied in a direction perpendicular to the plane of the bubble-supporting film may form small localized regions of polarization aligned opposite to the general polarization direction. Such localized regions are called magnetic bubble domains, and are of generally cyclindrical configuration. The magnetic bubble domains may be manipulated along the overlay pattern by a magnetic drive field which rotates in the plane of the bubble-supporting film of the chip 10. The bubble domains may thus be used to perform logical operations which are controlled by circuitry external to the chip, the signals for these operations being supplied by signal leads bonded to the overlay pattern on the chip 10 via bonding pads 11, which are also disposed on the bubble-supporting magnetic film of the chip 10 being arranged about the marginal portions thereof. The bubble domain chip 10 is mounted on an insulating film interconnect member 12 which interfaces the bonding pads 11 with external leads 20 of the package as subsequently described.

Figure 3:
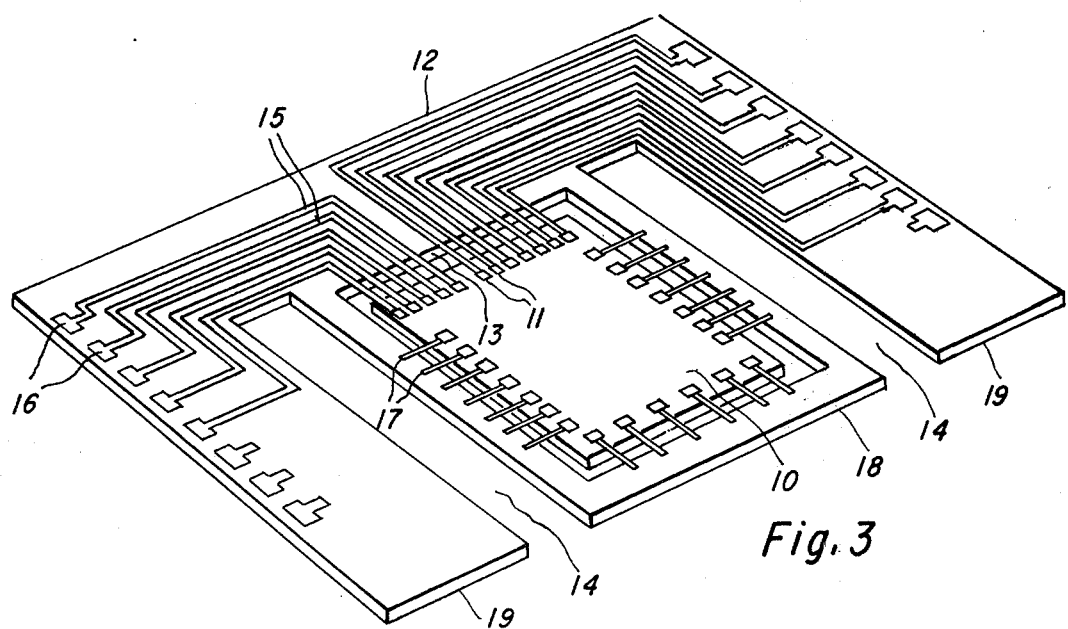
FIG. 3 is a perspective view of an insulating film interconnect member having a magnetic bubble domain chip mounted thereon and comprising a component of the magnetic bubble domain package of FIG. 1.

Referring to FIG. 3, the subassembly of the chip 10 and the interconnect member 12 on which it is mounted is illustrated in greater detail. The interconnect member 12 comprises a thin insulating film and may be formed of any suitable insulating material, one example of which is Kapton polyimide plastic film, marketed by E. I. DuPont de Nemours and Company of Wilmington, Delaware. The interconnect member 12 is generally E-shaped in configuration and is formed to include a chip-supporting central portion 18 having a substantially rectangular aperture 13 in the center thereof. The interconnect member 12 is further provided with a pair of longitudinal slots 14 in parallel relationship and flanking the opposite sides of the central chip-supporting portion 18. The slots 14 cooperate with the remainder of the interconnect member 12 to define parallel leg portions 19 spaced from the central portion 18 by the longitudinal slots 14. A plurality of narrow line conductors 15 are disposed on the surface of the interconnect member 12. The conductors 15 are arranged in substantially parallel relationship to each other and include terminal end portions overhanging into the aperture 13 of the central portion 18. The opposite ends of the conductors 15 terminate on enlarged conductive bonding pads 16 which are disposed in spaced apart linear relationship along the outer marginal portions of leg portions 19. A plurality of conductive terminals 17 are also disposed on the surface of the interconnect member 12, the conducting terminals 17 being mounted on the central portion 18 along the perimeter of the aperture 13 and overhanging into the aperture 13. It will be understood that the narrow line conductors 15, the conductive bonding pads 16, and the conductive terminals 17 may be formed of any suitable electrically conductive metal, such as copper for example. The conductors 15, the bonding pads 16, and the conductive terminals 17 are preferably plated, using a suitable electroplating technique with a metal having a relatively low melting temperature so as to permit the metal plating to serve as a solder material in subsequent bonding operations. Tin is a suitable metal for this purpose.

Figure 4:
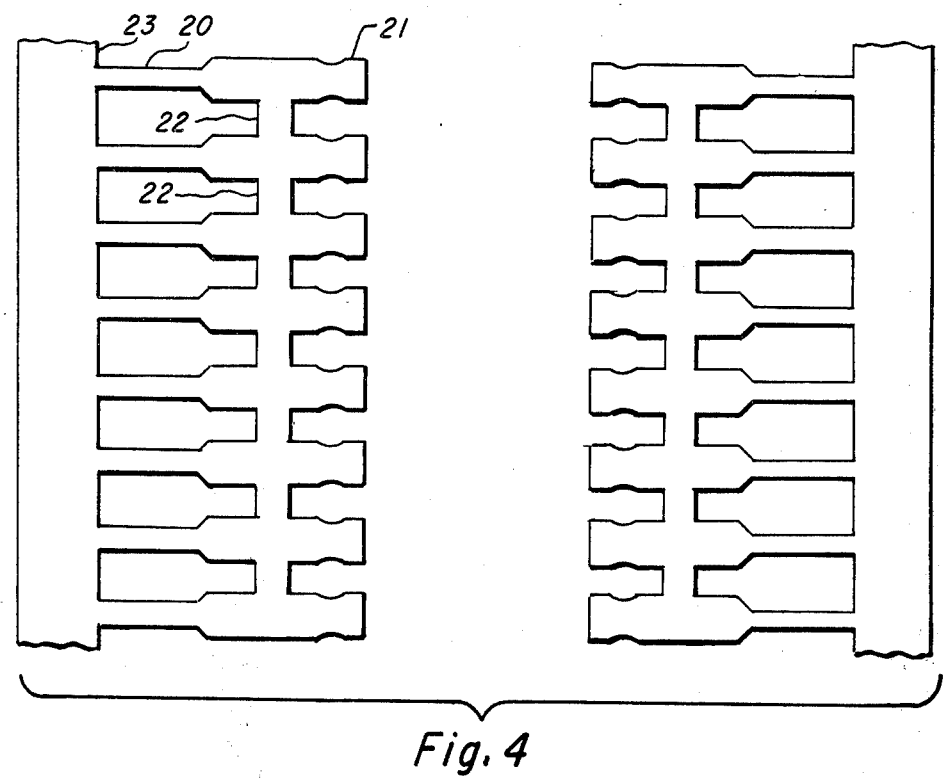
FIG. 4 is a plan view of a lead frame used in the magnetic bubble domain package of FIG. 1.

FIG. 4 illustrates a lead frame which is substantially similar in the construction to that disclosed in U.S. Pat. No. 3,859,718. The lead frame may be constructed of any suitable electrically conductive metal, such as copper for example, and includes a plurality of signal leads 20 and corresponding lead ends 21, the signal leads 20 and corresponding lead ends 21 being formed in two opposing sets which are spaced apart a distance corresponding to the distance between the bonding pads 16 on the opposite leg portions 19 of the interconnect member 12. The lead frame further includes tie bars 22 extending between adjacent spaced lead ends 21 and guide rails 23 connecting the outer ends of the signal leads 20 which reinforce the lead frame against damage to the signal leads 20 during fabrication of the package. These tie bars 22 and guide rails 23 are trimmed away after the incorporation of the lead frame into the package. The lead frame is plated, using a suitable electroplating technique, with a metal such as tin for example, the melting temperature of which is sufficiently low so as to permit its use as a solder.

In the fabrication of the package, the magnetic bubble domain chip 10 is positioned within the aperture 13 of the chip-supporting central portion of the interconnect member 12, and a suitable high speed bonding operation, such as the gold/tin reflow bump bonding technique disclosed in copending U.S. application Ser. No. 710,763 filed July 30, 1976, now U.S. Pat. No. 4,110,838 issued Aug. 29, 1978, is employed. Bonding pads 11 on the magnetic bubble domain chip 10 are thus electrically connected to the narrow line conductors 15 and to the conductive terminals 17, the latter connection between the terminals 17 and the bonding pads 11 serving to provide additional support for the bubble domain chip 10 in the aperture 13. Provided that the respective connections between the narrow line conductors 15 and the bonding pads 11 afford adequate support for the magnetic bubble domain chip 10 within the aperture 13, the conductive terminals 17 and the bonding pads 11 associated therewith could be eliminated. In a second bonding operation, the lead ends 21 of the lead frame are brought into contact with the bonding pads 16 and electrically connected thereto. The chip/interconnect member/lead frame assembly is then encapsulated with a thin layer or film 25 of molding material to form the molded subassembly of FIG. 5. This molding operation, which will be described in more detail hereinafter, leaves signal leads 20 extending from the opposite sides of the molded assembly and preserves the shape of the interconnect member 12.

Figure 6:
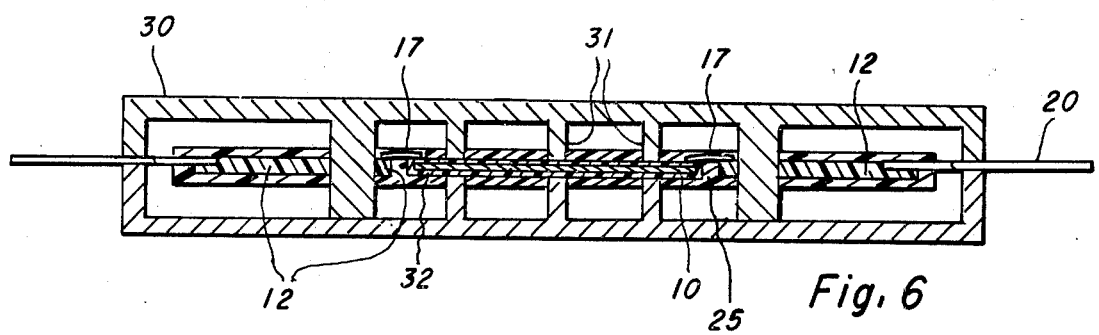
FIG. 6 is a cross-sectional view of a mold used to encapsulate the chip subassembly to form the structure of FIG. 5.
Figure 5:
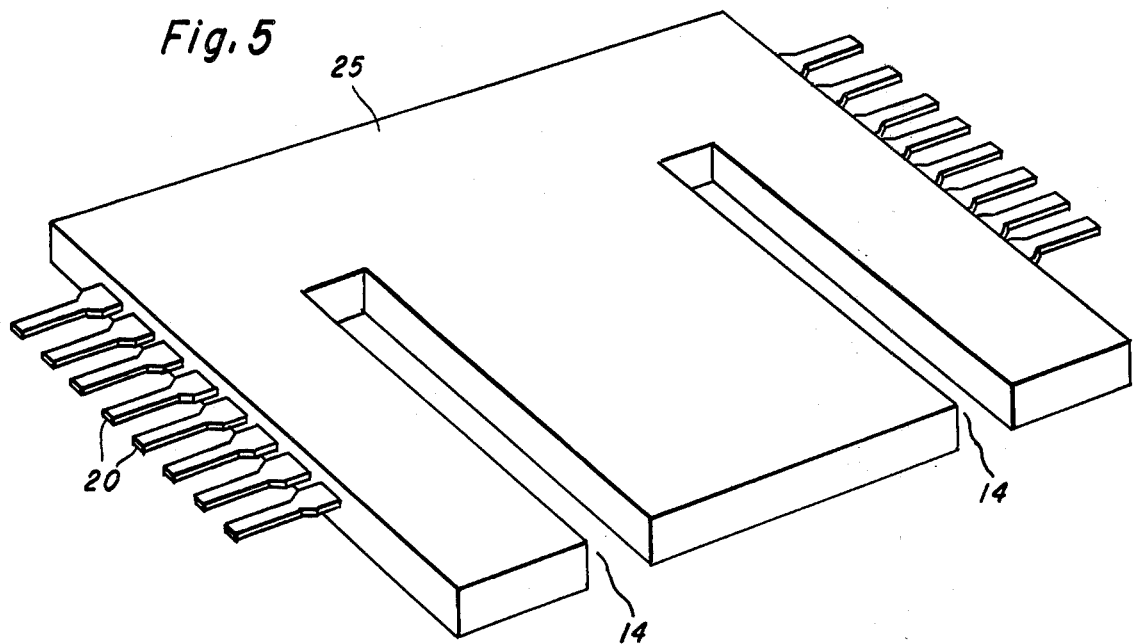
FIG. 5 is a perspective view of a molded chip subassembly in which the structure of FIG. 3 with the lead frame of FIG. 4 bonded thereto is encapsulated in a film of molding material.

A suitable mold 30 for encapsulating the chip/interconnect member/lead frame assembly to produce the molded subassembly of FIG. 5 is shown in FIG. 6. The magnetic bubble domain chip 10 as bonded to the interconnect member 12 is supported within the mold housing 30 by cylindrical support pins 31 which are part of the mold 30 and respectively extend from the upper and lower housing portions of the mold 30 into engagement with the upper and lower surfaces of the chip 10. The support pins 31 are arranged in two sets of three pins each with the pins 31 of each set being disposed in a triangular configuration. The first set of pins 31 extends from the upper housing portion of the mold 30, and the second set of pins 31 extends from the lower housing portion of the mold 30. The two sets of support pins 31 are vertically aligned and are spaced apart a distance approximating the thickness of the magnetic bubble domain chip 10. These support pins 31 are provided in the mold 30 because tilting of the magnetic bubble domain chip 10 during the molding operation could cause uneven flow of molding material 25, thereby inducing a strain on the bonds between the chip 10 and the conductors 15. In addition, the length of the support pins 31 is such as to positively place the magnetic bubble domain chip 10 within the vertical center of the molded subassembly of FIG. 5. Prior to this molding operation, the magnetic bubble domain chip 10 is preferably coated with a suitable soft plastic film 32 to protect the chip 10 from being placed under strain from shrinkage of the molding material 25 within which the chip 10 is to be subsequently encapsulated. The molding material 25, which may be any suitable molding material, such as Novalak III for example, is then introduced into the mold 30, thereby producing the molded subassembly shown in FIG. 5.

Figure 7:
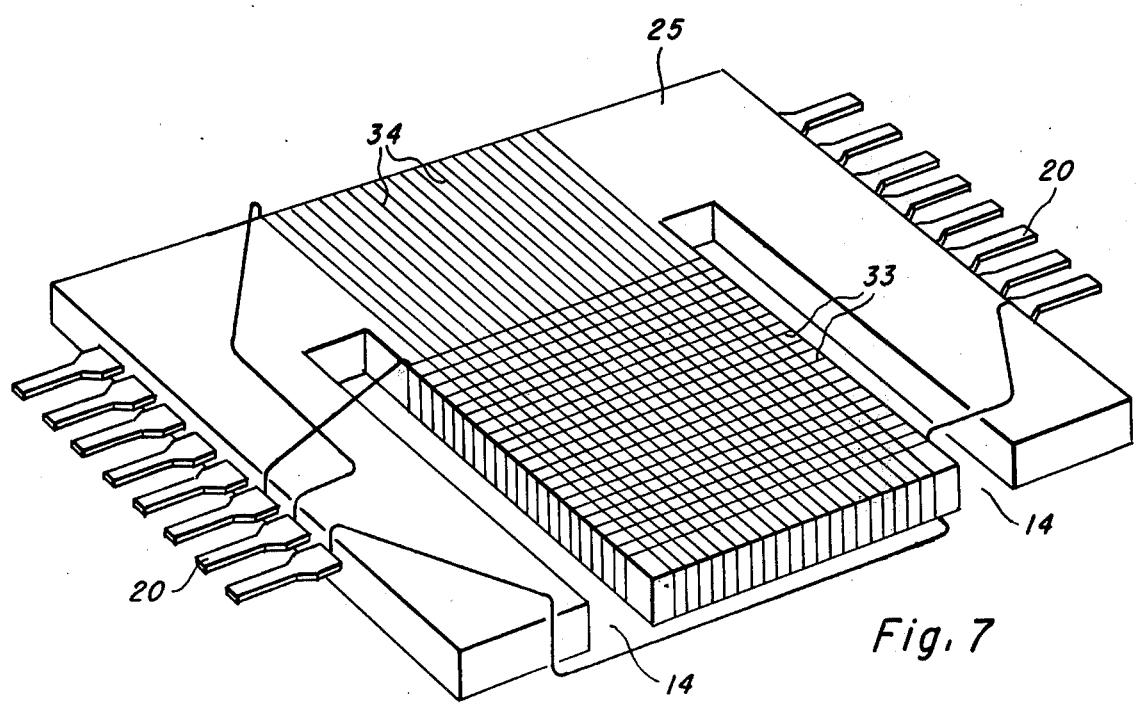
FIG. 7 is a perspective view of a chip/drive field coil subassembly in which the molded subassembly in FIG. 5 is provided with inner and outer drive field coils wound around the molded subassembly in orthogonal relationship with respect to each other.

Referring to FIG. 7, the molded subassembly of FIG. 5 is illustrated with the drive field coil assembly comprising first and second coils 33 and 34 mounted thereon. The first inner coil 33 is constructed of a suitable insulated electrically conductive wire, and may be directly wound onto the molded subassembly or may be prewound and slipped onto the subassembly. The inner coil 33 is positioned to encompass the chip-supporting central portion 18 of the interconnect member 12, the coil 33 being wound through the longitudinal slots 14 with the winding axis being the center bar of the "E" shaped molded subassembly. The second outer coil 34 is also wound about the center portion of the "E" shaped molded subassembly in orthogonal relationship to the inner coil 33 with the winding axis of the outer coil 34 being perpendicular to that of the inner coil 33. The outer coil 34 is also constructed of a suitable insulated electrically conductive wire and may be wound directly onto the molded subassembly or may be prewound and slipped onto the subassembly. The inner coil 33 and the outer coil 34 are preferably secured to the molded subassembly by a suitable adhesive material, such as an epoxy resin and are connected at respective terminals to signal leads 20 extending from the molded subassembly. Two sinusoidal signals, which are 90° out of phase with each other are provided through these signal leads 20 to the respective coils 33 and 34 in order to produce a rotary magnetic drive field. It will be observed from FIG. 1 that the position of the magnetic bubble domain chip 10 relative to the drive field coils 33 and 34, which is determined by the shape of the interconnect member 12 and the molding operation described in the discussion of FIG. 6, is the most effective position for reliable operation of the device. The placement of the magnetic bubble domain chip 10 in the geometric center of the drive field coils 33 and 34 in the manner described substantially eliminates noise interference in the operation of the device. In addition, the volume of the drive field coils 33 and 34 is reduced to a minimum since only a thin film 25 of molding material encapsulates the chip 10 and the interconnect member 12 on which it is mounted.

Referring again to FIG. 2, the aforementioned molded subassembly with drive field coils 33 and 34 mounted thereon is positioned in a centered location within an open-ended tubular housing 40 of substantially rectangular cross-section. The housing 40 is constructed of a suitable magnetic shielding material, such as a 78% nickel, 22% iron composition for example. The housing 40 provides an external enclosure for the device and shields the magnetic bubble domain chip 10 from stray magnetic fields which may be present in the operating environment. Magnetic bias field means for providing the magnetic bias field perpendicular to the plane of the bubble-supporting film of the chip 10 is mounted within the housing. The magnetic bias field means comprises a pair of substantially rectangular plates 41 of a permanent magnet material, such as Idox for example, respectively secured to the interior planar surfaces at the top and bottom of the housing 40, so that the permanent magnet plates 41 are parallel and in general registry with each other. The permanent magnet plates 41 may be secured to the aforesaid interior planar surfaces of the housing 40 by a suitable adhesive, such as epoxy resin, for example. The permanent magnet plates 41 may be magnetized to the desired field strength prior to incorporation into the package or may be magnetized after assembly, so as to provide the predetermined magnetic bias field. The magnetic bias field means may further include spreader plates 42 of a suitable soft magnetic material, such as silicon steel for example. The spreader plates 42 are of substantially rectangular configuration and are respectively secured to a corresponding one of the plates 41 so that major surfaces of the plates of each set of a permanent magnet plate 41 and a spreader plate 42 are disposed against each other in parallel contiguous relationship. Any suitable adhesive, such as an epoxy resin, for example, may be employed to secure the spreader plates 42 to the respective permanent magnet plates 41. The spreader plates 42 are dimensionally larger than permanent magnet plates 41 and are disposed so as to entirely cover the major surfaces of plates 41. The spreader plates 42 promote uniformity of the magnetic field produced by the permanent magnet plates 41 in that the soft magnetic material of the spreader plates 42 spreads the flux lines of the permanent magnet plates 41 over a larger area, thereby evening out the irregularities in the flux patterns in the field. The housing 40, the permanent magnet plates 41 and the spreader plates 42 cooperate to produce a magnetic bias field $H_B$, the flux paths being as indicated in FIG. 2.

In a final molding operation, a body of insulative molding material 43 fills the interior of the housing 40 and secures the chip/interconnect member/drive field coil subassembly of FIG. 7 within the magnetic bias field assembly. The signal leads 20 extend outwardly from the opposite open ends of the housing 40, with the chip/interconnect member/drive field coil assembly and the magnetic bias field assembly being embedded in the body of insulative molding material 43. Electrical access to the magnetic bubble domain chip 10 is provided through the signal leads 20 and the narrow line conductors 15 bonded to the bonding pads 11 on the magnetic bubble domain chip 10. The molding material of the body 43 may be any suitable molding material such as that used to initially encapsulate the chip/interconnect member subassembly.

While this invention has been described in relation to a preferred illustrated embodiment thereof, it is to be understood that various changes, substitutions, and alterations may be made therein without departing from the spirit and scope of the invention which is defined by the appended claims.

What is claimed is:

1. A packaging assembly for magnetic bubble domain chips comprising:
   a housing,
   an insulating interconnect member disposed within said housing, said interconnect member being provided with an aperture extending through a central portion thereof and having a pattern of electrical conductors disposed thereon, the central portion of said interconnect member being coplanar with the remainder of said interconnect member,
   a magnetic bubble domain chip mounted in the central portion of said interconnect member within the aperture defined therethrough in supported relationship, said magnetic bubble domain chip being in electrical contact with said electrical conductors disposed on said interconnect member and its surface lying substantially in the same plane of the corresponding surface of said interconnect member,
   a lead frame disposed within said housing and having a plurality of signal leads extending outwardly of said housing, respective signal leads being in electrical contact with corresponding electrical conductors disposed on said interconnect member,
   coil means within said housing surrounding said magnetic bubble domain chip and operable to produce an in-plane rotary magnetic field at the surface of said magnetic bubble domain chip in response to electrical energization thereof, said coil means being in electrical contact with corresponding ones of said signal leads,
   magnetic bias field means disposed within said housing in spaced relation to said magnetic bubble domain chip for producing a magnetic field at least substantially perpendicular to the surface of said magnetic bubble domain chip, and
   a body of insulating material filling said housing and in which said interconnect member, said magnetic bubble domain chip, said coil means, and said magnetic bias field means are embedded.

2. A packaging assembly as set forth in claim 1, wherein said interconnect member is provided with a pair of longitudinal slots flanking the opposite sides of the central portion thereof so as to define a pair of parallel elongate leg portions extending along the opposite sides of the central portion in spaced relation thereto,
   each of said leg portions of said interconnect member being provided with a plurality of spaced bonding pads extending lengthwise therealong, and
   said bonding pads electrically interconnecting respective signal leads of said lead frame with the said corresponding electrical conductors disposed on said interconnect member.

3. A packaging assembly as set forth in claim 1, wherein said interconnect member and said magnetic bubble domain chip are disposed within said housing substantially equidistant from the upper and lower walls thereof.

4. A packaging assembly as set forth in claim 1, further including a soft protective film of insulating material coating said magentic bubble domain chip and interposed between said chip and said body of insulating material for protecting said chip from being subjected to strain.

5. A packing assembly as set forth in claim 1, wherein said coil means comprises a first coil of insulated conductive wire wound about the central portion of said interconnect member and said magnetic bubble domain chip, and
   a second coil of insulated conductive wire wound around the central portion of said interconnect member and said magnetic bubble domain chip in orthogonal relationship with respect to said first coil.

6. A packaging assembly as set forth in claim 5, wherein said interconnect member is further provided with a pair of parallel longitudinal slots flanking the opposite sides of the central portion thereof, and
   said first coil being received in said longitudinal slots and in encompassing relationship to the central portion of said interconnect member and said magnetic bubble domain chip within the aperture thereof.

7. A packaging assembly as set forth in cliam 6, wherein said magnetic bubble domain chip is mounted at the geometric center of the space enclosed by said first and second coils.

8. A packaging assembly for magnetic bubble domain chips comprising:
   a housing,
   an insulating interconnect member disposed within said housing, said interconnect member being provided with an aperture extending through a central portion thereof and having a pattern of electrical conductors disposed thereon, the central portion of said interconnect member being coplanar with the remainder of said interconnect member,
   a magnetic bubble domain chip mounted in the central portion of said interconnect member within the aperture defined therethrough, the surface of said magnetic bubble domain chip lying substantially in the same plane of the corresponding surface of said interconnect member,
   the electrical conductors included in said pattern of electrical conductors disposed on said interconnect member having terminal end portions overhanging an aperture-adjoining edge of said interconnect member and extending into the aperture into electrical connection with said magnetic bubble domain chip received therein,
   said terminal end portions of said electrical conductors disposed on said interconnect member providing support for said magnetic bubble domain chip to retain said chip in the aperture in the central portion of said interconnect member,
   a lead frame disposed within said housing and having a plurality of signal leads extending outwardly of said housing, respective signal leads being in electrical contact with corresponding electrical conductors disposed on said interconnect member,
   coil means within said housing surrounding said magnetic bubble domain chip and operable to produce an in-plane rotary magnetic field at the surface of said magnetic bubble domain chip in response to electrical energization thereof, said coil means being in electrical contact with corresponding ones of said signal leads,
   magnetic bias field means disposed within said housing in spaced relation to said magnetic bubble domain chip for producing a magnetic field at least substantially perpendicular to the surface of said magnetic bubble domain chip, and
   a body of insulating material filling said housing and in which said interconnect member, said magnetic bubble domain chip, said coil means, and said magnetic bias field means are embedded.

9. A packaging assembly as set forth in claim 8, further including additional means supporting said magnetic bubble domain chip within the aperture of the central portion of said interconnect member.

10. A packaging assembly as set forth in claim 9, wherein said additional support means comprises a plurality of wires arranged about the periphery of the aperture and respectively connected to the central portion of said interconnect member and to said magnetic bubble domain chip.

* * * * *